(12) United States Patent
Shoulders

(10) Patent No.: US 7,235,982 B1
(45) Date of Patent: Jun. 26, 2007

(54) RE-CALCULATING S-PARAMETER ERROR TERMS AFTER MODIFICATION OF A CALIBRATED PORT

(75) Inventor: Robert E. Shoulders, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/394,686

(22) Filed: Mar. 31, 2006

(51) Int. Cl.
G01R 27/32 (2006.01)
G01R 35/00 (2006.01)

(52) U.S. Cl. .................. 324/638; 324/639; 324/601

(58) Field of Classification Search ............... 324/638, 324/639
See application file for complete search history.

(56) References Cited

U.S. PATENT DOCUMENTS

| | | | |
|---|---|---|---|
| 5,748,000 A * | 5/1998 | Blackham | 324/601 |
| 6,081,125 A * | 6/2000 | Krekels et al. | 324/601 |
| 6,836,743 B1 * | 12/2004 | Blackham et al. | 702/107 |
| 2004/0160228 A1 * | 8/2004 | Jamneala et al. | 324/601 |

OTHER PUBLICATIONS

Jargon and Marks, Two-Tier Multiline TRL for Calibration of Low-Cost Network Analyzers, 46th ARFTG Conference Digest, pp. 1-8 (Dec. 1995).

Marks, Formulations of the Basic Vector Network Analyzer Error Model Including Switch Terms, 50th ARFTG Conference Digest, pp. 115-126 (Dec. 1997).

Ferrero and Pisani, QSOLT: A New Fast Calibration Algorithm for Two Port S Parameter Measurements, 38th ARFTG Conference Digest, pp. 15-21 (Dec. 1991).

U.S. Appl. No. 11/028,159, entitled Method For Implementing TRL Calibration in VNA, filed Jan. 3, 2005 by Kenneth H. Wong, David V. Blackham, James Llu, and Kieth F. Anderson.

U.S. Appl. No. 11/028,032, entitled Multiport Calibration Simplification Using the "Unknown Thru" Method, filed Jan. 3, 2005 by Keith F. Anderson, David V. Blackham, Brad R. Hokkanen, adn Kenneth H. Wong.

U.S. Appl. No. 11/127,852, entitled Power Calibration for Multi-Port Vector Network Analyzer (VNA), filed May 12, 2005 by Robert E. Shoulders, David V. Blackham, and Kenneth H. Wong.

\* cited by examiner

*Primary Examiner*—Anjan Deb
*Assistant Examiner*—Jeff Natalini

(57) ABSTRACT

A two-port S-parameter calibration between a first port and a second port of a test system having a multi-port vector network analyzer is performed to provide a first S-parameter calibration of the test system. A transfer device is connected between the first and second ports of the test system. A port of the test system is changed to provide a second state of the test system, and a plurality of ratioed un-corrected parameters of the transfer device are measured with the test system in the second state. A second S-parameter calibration of the test system in the second state is determined using the ratioed un-corrected parameters and S-parameter data.

13 Claims, 3 Drawing Sheets

RE-CALCULATING S-PARAMETER ERROR TERMS AFTER MODIFICATION OF A CALIBRATED PORT

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Obtaining accurate measurements of two port devices with a vector network analyzer ("VNA") uses a two-port calibration to characterize the systematic errors of the instrument and test set. Calibration is typically performed using a number of calibration devices of pre-determined characteristics, such as a short, an open, a termination of known impedance, and one or more through lines of known electrical lengths, or an electronic calibration ("E-cal") device, which is a programmable device that selectively provides a sequence of calibration standards. These devices are commonly known as "calibration standards."

In many cases, a customer needs to alter the VNA or test set while measuring a device under test ("DUT"). One example of this is changing the value of an attenuator to optimize the measurement of both high and low power (either input or output) conditions of the DUT. Unfortunately, such a change in the test environment invalidates the two-port S-parameter calibration made with the VNA/test set in its previous state.

One technique for addressing this problem is to re-calibrate the test system (i.e. the VNA and test set) with the calibration standards after the test system has been configured to its new state. However, this requires disconnecting the DUT, connection of the calibration standards, and execution of a complete 2-port S-parameter calibration, requiring the measurement of multiple calibration standards, or multiple states of an E-cal device. While this approach produces good results, it is inconvenient, time consuming, and disrupts the test sequence flow of the DUT.

Another technique is to calibrate all desired states of the test system prior to measuring the DUT. This approach is time consuming, even if the customer knows in advance which states the test system needs to be calibrated for. A customer does not always know which test system states will be used when testing a DUT. If the customer does not know which test system states need to be calibrated for, a complete calibration of all possible states is usually done. This is very time consuming because each state requires execution of a complete 2-port S-parameter calibration, requiring the measurement of multiple calibration standards, or multiple states of an electronic calibration device.

Sometimes, approximations of the effects of a state change of the test system are used to avoid some portions of the time-consuming calibrations. Unfortunately, such approximations result in increased measurement uncertainty, and hence less accurate measurements.

Therefore, an improved technique for measuring a DUT after a calibrated port has been modified that provides accurate network measurements is desirable.

BRIEF SUMMARY OF THE INVENTION

A two-port S-parameter calibration between a first port and a second port of a test system having a multi-port vector network analyzer is performed to provide a first S-parameter calibration of the test system. A transfer device is connected between the first and second ports of the test system. A port of the test system is changed to provide a second state of the test system, and a plurality of ratioed un-corrected parameters of the transfer device are measured with the test system in the second state. A second S-parameter calibration of the test system in the second state is determined using the ratioed un-corrected parameters and S-parameter data.

DETAILED DESCRIPTION OF THE EMBODIMENTS

Figure 1:
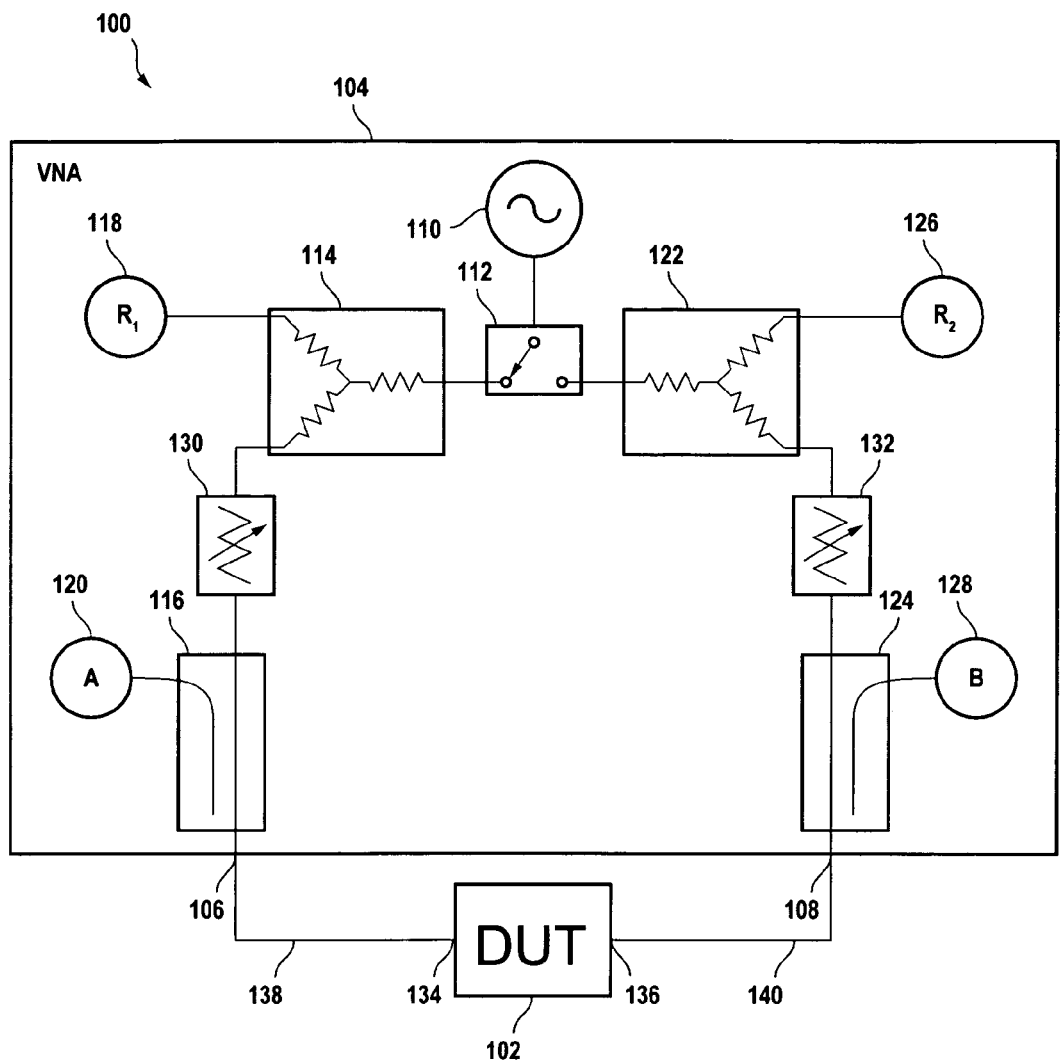
FIG. 1 is a diagram of a test system and DUT suitable for performing methods according to embodiments.

FIG. 1 is a diagram of a test system 100 and DUT 102 suitable for performing methods according to embodiments. The test system 100 includes a multi-port VNA 104 with a first VNA port 106 and a second VNA port 108. Alternatively, a VNA having additional ports is used. The VNA 104 includes a source 110 that is selectively coupled to the first VNA port 106 or to the second VNA port 108 according to the position of a test port selector switch 112. In the illustrated position, the source 110 is coupled to the first VNA port 106 through a first reference power splitter 114 and first test directional coupler 116. Alternatively, a coupler or other device is used instead of a reference power splitter. The test system 100 is calibrated at the test ports 134, 136. The calibration accounts for instrument errors, as well as measurement errors that arise due to the test set, such as from frequency-dependent loss through test cables 138, 140. For purposes of discussion, and as is generally used in the art of high-frequency test and measurement, "change to a port" means a change that would otherwise invalidate the calibration of a test port (e.g. a change in the signal path between the DUT 102 and the source 110, the reference receiver $R_1$, or the test receiver A).

A first reference receiver 118 ("$R_1$") measures incident power that is proportional to the power delivered to the first test system port 134 from the source 110. A first test receiver 120 ("A") measures reflected power, for example, power reflected from the DUT 102. The VNA 104 also includes a second reference power splitter 122, a second test directional coupler 124, a second reference receiver 126 ("$R_2$"), and a second test receiver 128 ("B").

The test system 100 also includes a first variable attenuator 130 in the signal path between the first reference power splitter 114 and first test directional coupler 116, and a second variable attenuator 132 in the signal path between the second reference power splitter 122 and first second directional coupler 124. It is difficult to de-embed the variable attenuators 130, 132 because to do so typically requires that ability to perform a calibration on both sides of the device (attenuator), and because there is no reflectometer between the attenuator and power splitter.

Using a standard calibration and measurement technique, a full two-port calibration is required for each combination of attenuator settings that will be used during the measurement. If any combination of attenuator setting might be used, a full calibration of four step attenuators, each having five states, would require $5^4$, or 625, full two port calibrations. Each calibration typically uses at least four calibration standards (short, open, load, and termination, or "SOLT"), each of which is measured in both the forward and reverse directions (eight sweeps total). Thus, 5,000 sweeps are performed. With one embodiment, in which one two-port calibration uses two sweeps per state (of a transfer device, as will be explained below) for each unique port state results in only 108 sweeps, which reduces the number of sweeps by almost a factor of fifty and avoids needing to swap a series of calibration standards on the test ports 134, 136, greatly simplifying and speeding the calibration process, and hence measurement, after a state change in one of the paths of the test system.

However, embodiments of the invention are not limited to changes in attenuator states. Any linear device, such as filters, isolators, and amplifiers, inserted into the test set can be accommodated, one port at a time. Similarly, other linear changes to one signal path of the test set, such as a significant change in a test cable 138, can be accommodated, as well as multiple linear changes. This allows tailoring the test system (test set)(for multiple measurements using a single two-port calibration. For example, an isolator or filter might be switched in for intermodulation testing of a DUT and switched out for isolation testing of the DUT. Embodiments even allow for switching to a third port of the test system (not shown) for testing the DUT.

In a particular embodiment, the first and second variable attenuators are step attenuators, for example, attenuators that provide attenuation from 0 dB to 70 dB in 10 dB steps. Variable attenuators are alternatively located in the VNA between the reference power splitters 114, 122 and the reference receivers 118, 126. In yet other alternatives, variable attenuators are located in the VNA between the test directional couplers 116, 124 and the test receivers 120, 128.

Variable attenuators are used in a variety of test and measurement applications and are highly desirable for avoiding damage to a DUT and/or VNA, as well as testing both high- and low-power conditions of the DUT. For example, it may be desirable to test a DUT at a very low input power level that is below the control range of the source 110, as well as at a higher input power level that is within the control range of the source 110. The first measurement is made with a selected amount of attenuation (e.g. 20 dB) so that the source operates within its control range, yet only a fraction of the source power is applied to the DUT because of the selected attenuation provided by the variable attenuator, and then the attenuator is switched to 0 dB so that essentially all the power from the source is provided to the DUT for the second measurement.

In this example, the plane of calibration and measurement (i.e. the "test ports" 134, 136 of the test system 100) occur at the planes of the first and second ports of the DUT. A two-port calibration is performed at the test ports by dis-connecting the DUT and connecting the calibration standards or and electronic calibration ("E-cal") device to the ends of the test cables 138, 140, measuring the calibration standards, and calculating the error correction terms. For example, if a short is connected to the first test port 134, the electrical lengths and interfaces of the test system will result in measuring something other than a "perfect" short. These error terms are stored so that they may be calibrated out when a DUT is measured. The state of the switch 112 changes during calibration, which is why there are two sets of error terms (see FIGS. 2A, 2B).

If the state of the test system 100 is changed, such as by changing an attenuator setting, the calibration is no longer valid because both the electrical length and the interfaces through the attenuator have changed. Prior to changing the state of the test system, the S-parameters of a stable, two-port device (e.g. DUT 102, assuming the S-parameters of the DUT are stable) is connected between the test ports are determined (i.e. measured and corrected) using the two-port calibration terms that has been performed. Alternatively, the S-parameters of the stable two-port device are known by other means. For example, the S-parameters of a zero-length through connection between the test planes (i.e. connecting the ends of the test cables 138, 140 together) are known by definition. This device will be referred to as a "transfer device."

With the transfer device, which in a particular embodiment is a stable DUT, connected between the test ports 134, 136, one port of the test system is changed to a new desired state. The other port of the test system remains static. In other words, a change to one of the test ports is allowable, but the other port (e.g. switch 112, splitter 122, receivers 126, 128, attenuator 132, coupler 124, and cable 140) remains the same.

For example, the first variable attenuator 130 is programmed to provide a different amount of attenuation, while the second variable attenuator 132 remains in the same configuration as during the calibration. Three ratioed parameters are measured with the VNA in a first direction (e.g. with the test port selector switch 112 in the position shown in FIG. 1), and three ratioed parameters are measured with the VNA in a second direction (e.g. with the test port selector switch 112 in the position opposite from that shown in FIG. 1). These three ratioed parameters are un-corrected because no s-parameter correction is applied to them.

However, since the S-parameters of the transfer device are known, a new S-parameter calibration for the modified test system state is determined using the uncorrected ratio measurements and the error terms for the un-changed port of the test system from the previous S-parameter calibration. If desired, the other port of the test system may then be changed to a new desired state, and a new S-parameter calibration obtained for this state using a similar technique.

Figure 2A:
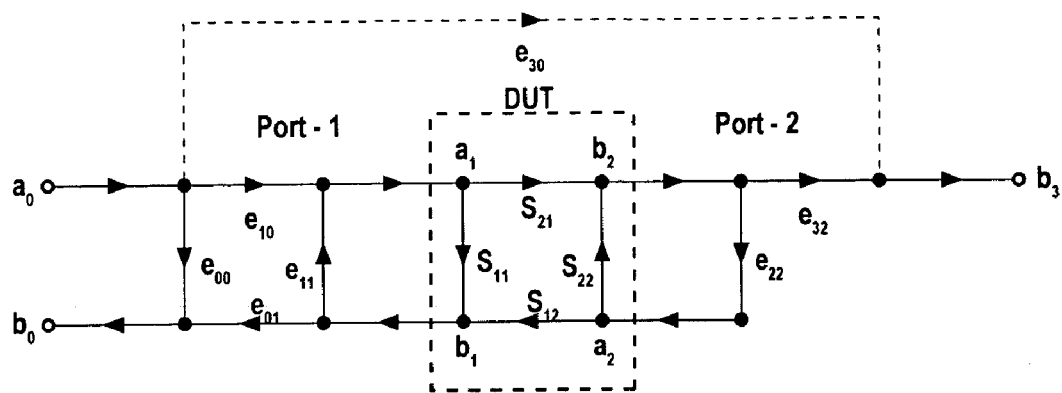
FIG. 2A shows a forward model of the DUT in the test system of FIG. 1 illustrating an embodiment of the invention.

FIG. 2A shows a forward model of the DUT in the test system of FIG. 1 illustrating an embodiment of the invention. A full two-port S-parameter calibration of the test system has been performed, which yields a twelve-term error correction model, as is known in the art of high-frequency vector measurements. FIG. 2A illustrates six terms of the twelve-term error model. The nodes shown in FIG. 2A all relate to the test system 100 of FIG. 1 when the switch 112 is in the position shown ("forward configuration"). Node $a_0$ is the complex value measured by the first reference receiver (R1) 118 with no correction applied. Node $b_0$ is the complex value measured by the first test receiver (A) 120, with no correction applied. Node $a_1$ is the signal actually incident upon the DUT 102 at the first test port 134.

Node $b_1$ is the signal actually incident upon the first test port 134. Node $b_2$ is the signal actually incident upon the second test port 136. Node $a_2$ is the signal actually incident upon the DUT 102 at the second test port 136. Node $b_3$ is the complex value measured by the second test receiver (B) 128 with no correction applied.

The S-parameters of the transfer device are obtained by measurement using the S-parameter calibration or other means, such as prior characterization of the transfer device. These will be referred to as $S_{11}$, $S_{21}$, $S_{12}$, and $S_{22}$. The leakage term $e_{30}$ is assumed to be zero, with is valid for many VNAs. If the leakage cannot be assumed to be zero, it must be determined by additional measurements of devices with $S_{12}$ and $S_{21}$ both equal to zero. For the remainder of discussion, it is assumed that the leakage terms are zero. For purposes of convenient discussion, the following definitions will be used:

| | |
|---|---|
| $e_{00}$ | Forward Directivity Error ("EDF") |
| $e_{11}$ | Forward Source match Error ("ESF") |
| $(e_{10}e_{01})$ | Forward Reflection Tracking Error ("ERF") |
| $(e_{10}e_{32})$ | Forward Transmission Tracking Error ("ETF") |
| $e_{22}$ | Forward Load match Error ("ELF") |
| $e_{30}$ | Forward Crosstalk Error ("EXF") |

The six measurements indicated above are made after the state of one port of the test system has been changed. Since the original calibration is not valid for these measurements, they will be referred to as "raw" measurements. As an alternative to making all six of the raw measurements at the time of the state change, two of these terms (referred to as switch correction terms) may be determined or known by other means, an example of which is described in *Two-Tier Multi-line TRL for Calibration of Low-Cost Network Analyzers* by J. A. Jargon and R. A. Marks, 46th ARFTG Conf. Digest, pp. 1-8 (December 1995), which also describes additional nodes that are omitted FIGS. 2A and 2B for simplicity of illustration. In some cases, an accurate S-parameter calibration for the altered test system state can be accurately determined with the DUT attached, eliminating the need to disconnect the DUT. In other cases, practical considerations (such as non-linearity of the DUT) may prevent determination of the new S-parameter calibration with the DUT attached.

Figure 2B:
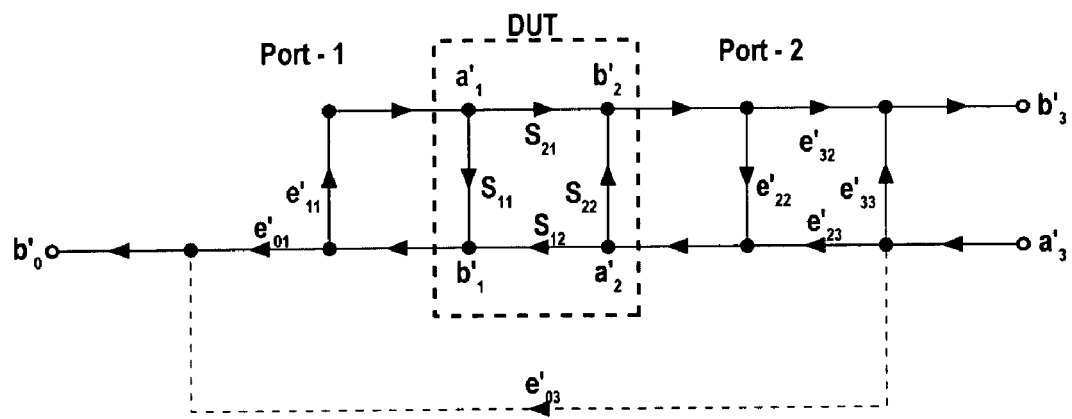
FIG. 2B shows a reverse model of the DUT in the test system of FIG. 1 illustrating an alternative embodiment of the invention.

FIG. 2B shows a reverse model of the DUT in the test system of FIG. 1 illustrating an alternative embodiment of the invention. The nodes shown in FIG. 2B all relate to the test system 100 of FIG. 1 when the switch 112 is in the position opposite to that shown ("reverse configuration"). Node $a'_3$ is the complex value measured by the second reference receiver (R2) 126, with no correction applied. Node $b'_3$ is the complex value measured by the second test receiver (B) 128, with no correction applied. Node $a'_2$ is the signal actually incident upon the DUT 102 at the second test port 136, Node $b'_2$ is the signal actually incident upon the second test port 136. Node $b'_1$ is the signal actually incident upon the first test port 134. Node $a'_1$ is the signal actually incident upon the DUT 102 at the first test port 134. Node $b'_0$ is the complex value measured by the first test receiver (A) 120, with no correction applied.

For purposes of convenient discussion, the following definitions will be used:

| | |
|---|---|
| $e'_{33}$ | Reverse Directivity Error ("EDR") |
| $e'_{11}$ | Reverse Load match Error ("ELR") |
| $e'_{23}e'_{32}$ | Reverse Reflection Tracking Error ("ERR") |
| $e'_{23}e'_{01}$ | Reverse Transmission Tracking Error ("ETR") |
| $e'_{22}$ | Reverse Source match Error ("ESR") |
| $e'_{03}$ | Reverse Crosstalk Error ("EXR") |

For purposes of illustration, a change to port 2 of the test system will be discussed. A similar technique applies if only port 1 is changed. Following a state change on port 2, the error terms associated with port 2 may all change, but the error terms associated with port 1 alone are not affected. Following a state change on port 2, the error vectors $e_{00}$, $e_{01}$, $e_{10}$, $e_{11}$ (see FIG. 2A), $e'_{11}$ and $e'_{01}$ (see 2B) are unchanged, since they are effected only by the state of port 1. The error terms $e_{32}$, $e_{22}$ (in FIG. 2A), $e'_{22}$, $e'_{32}$, $e'_{23}$, and $e'_{33}$ are affected by port 2 state changes, and error terms depending upon them need to be determined for a valid 2 port S-parameter calibration for the new state.

The S-parameters of the DUT can be defined as:

$S_{11} = b_1/a_1$ when $a_2 = 0$ $S_{21} = b_2/a_1$ when $a_2 = 0$ $S_{12} = b_1/a_2$ when $a_1 = 0$ $S_{22} = b_2/a_2$ when $a_1 = 0$ Note that none of these terms can be measured directly, but are effected by the errors of the test set. We can only measure $b_0$, $b'_0$, $a'_0$, $b_3$, $b'_3$, $a_3$, and $a'_3$. The purpose of the error model and the calibration is to determine the S-parameters from the quantities that are measurable.

Six measurements are made with the transfer device having known S-parameters connected between port one and port 2 of the VNA. These are the ratios $b_0/a_0$, $b_3/a_0$, and $a_3/b_3$ (with the VNA switched for forward measurements); $b'_3/a'_3$, $b'_0/a'_3$, and $a'_0/b'_0$ (with the VNA switched for reverse measurements).

The Following calibration terms depend only upon $e_{00}$, $e_{01}$, $e_{10}$, $e_{11}$, $e'_{11}$ and $e'_{01}$, and are therefore unchanged by the port 2 state change:

$$EDF = e_{00} \quad (1)$$

$$ESF = e_{11} \quad (2)$$

$$ERF = e_{10}e_{01} \quad (3)$$

$$ELR = e'_{11} \quad (4)$$

In describing the method of this calibration, the relationship between actual and measured scattering parameters (S-parameters) of a two-port device is developed using a "four-sampler" network analyzer, which is shown to have a set of error terms that are conveniently handled when expressed in terms of T "cascade" matrices, as is known in the art. Using this notation, X is a two-by-two matrix of terms that depend only upon systematic error terms for port 1 of the VNA, Y is a similar matrix describing only port 2 errors, T is a similar matrix depending only upon the actual S-parameters of the device being measured, and $T^m$ is a matrix defined by the uncorrected measurements made by the four-sampler analyzer of the device connected between ports 1 and 2.

$T^m = XTY$ where $$(6) \quad T = \frac{1}{s_{21}} \begin{bmatrix} (s_{12}s_{21} - s_{11}s_{22}) & s_{11} \\ -s_{22} & 1 \end{bmatrix}$$

$$(7) \quad X = \frac{1}{\alpha} \begin{bmatrix} (ERF - ESF^*EDF) & EDF \\ -ESF & 1 \end{bmatrix}$$

$$(8) \quad Y = \frac{\beta}{ERR} \begin{bmatrix} (ERR - ESR^*EDR) & ESR \\ -EDR & 1 \end{bmatrix}$$

Where $$\alpha = e_{10} \text{ and } \beta = e'_{23} \quad (9)$$

If we define:

$$(10) \quad \hat{X} = \begin{bmatrix} (ERF - ESF^*EDF) & EDF \\ -ESF & 1 \end{bmatrix} \text{ and}$$

$$(11) \quad \hat{Y} = \frac{\beta}{(\alpha^*ERR)} \begin{bmatrix} (ERR - ESR^*EDR) & ESR \\ -EDR & 1 \end{bmatrix}$$

then $$T^m = \hat{X} T \hat{Y} \quad (12)$$

Solving for $\hat{Y}$ $$\hat{Y} = T^{-1} \hat{X}^{-1} T^m \quad (13)$$

From the measurements (or from a-priori knowledge of the device), we have all of the terms of $\hat{X}$ and T, and:

$$(14) \quad T^m = \frac{1}{S_{21}^m} \begin{bmatrix} (S_{12}^m S_{21}^m - S_{11}^m S_{22}^m) & S_{11}^m \\ -S_{21}^m & 1 \end{bmatrix}$$

Up to this point, we have considered only a four-sampler VNA (see also, Marks reference, above), which can simultaneously stimulate and monitor the incident and scattered waves at both ports of the DUT. In practice, it is convenient to construct a VNA that stimulates only one port of the DUT at any given time, while monitoring the incident signal on the stimulated port and the scattered signals on both ports. Since only three signals are sampled for each stimulus state, this type of analyzer is referred to as a three-sampler analyzer, even though there may be four samplers present. FIGS. 1-1 and 1-2 show the error terms appropriate for a three-sampler VNA. The terms in the matrix $T^m$ are related to the uncorrected parameters measured using a three-sampler VNA by the following known equations:

$$(15) \quad S_{11}^m = \frac{(b_0/a_0) - (b'_0/a'_3)(b_3/a_0)(a_3/b_3)}{[1 - (b'_0/a'_3)(b_3/a_0)(a'_0/b'_0)(a_3/b_3)]}$$

$$(16) \quad S_{12}^m = \frac{(b'_0/a'_3) - (b_0/a_0)(b'_0/a'_3)(a'_0/b'_0)}{[1 - (b'_0/a'_3)(b_3/a_0)(a'_0/b'_0)(a_3/b_3)]}$$

$$(17) \quad S_{21}^m = \frac{(b_3/a_0) - (b'_3/a'_3)(b_3/a_0)(a_3/b_3)}{[1 - (b'_0/a'_3)(b_3/a_0)(a'_0/b'_0)(a_3/b_3)]}$$

$$(18) \quad S_{22}^m = \frac{(b'_3/a'_3) - (b'_0/a'_3)(b_3/a_0)(a'_0/b'_0)}{[1 - (b'_0/a'_3)(b_3/a_0)(a'_0/b'_0)(a_3/b_3)]}$$

With this information, we can solve equation (13) for $\hat{Y}$. Recall that $$(19) \quad \hat{Y} = \frac{\beta}{(\alpha^*ERR)} \begin{bmatrix} (ERR - ESR^*EDR) & ESR \\ -EDR & 1 \end{bmatrix} = \begin{bmatrix} \hat{y}_{11} & \hat{y}_{12} \\ \hat{y}_{21} & \hat{y}_{22} \end{bmatrix} \text{ and}$$

$$(20) \quad \frac{\beta}{\alpha} = ETR/[ERF + EDF(ELR - ESF)]$$

Using this fact, we can solve for the remaining unknown terms:

$$(21) \quad EDR = -\frac{\hat{y}_{21}}{\hat{y}_{22}}$$

$$(22) \quad ESR = \frac{\hat{y}_{12}}{\hat{y}_{22}}$$

$$k = 1/[ERF + EDF^*(ELR - ESF)] \quad (23)$$

$$ETR = (\hat{y}_{11} + EDR^*ESR^*\hat{y}_{22})/k \quad (24)$$

$$ERR = k^*ETR/\hat{y}_{22} \quad (25)$$

$$ELF = ESR + [(ERR^*a_3/b_3)/(1 - EDR^*a_3/b_3)] \quad (26)$$

$$ETF = (ERR + EDR(ELF - ESR))/(k^*ETR) \quad (27)$$

This completes the determination of the new 2-Port S-parameter calibration following the state change on port 2 (omitting isolation terms). The technique described above greatly improves the efficiency of either prior characterization of all desired states or re-characterization at the time of the state change because only one device (or device state) is needed to obtain the new s-parameter calibration error terms.

In the preceding derivation, a direct measurement was described as a means of determining the terms $a_3/b_3$ and $a'_0/b'_0$. Other methods of determining these two terms, referred to as "switch terms" are described in the prior art (see, e.g. U.S. patent application Ser. No. 11/028,159 entitled METHOD FOR IMPLEMENTING TRL CALIBRATION IN VNA by Wong et al., filed Jan. 3, 2005). These methods extend the applicability of the technique described herein to network analyzers with only one reference mixer, and to lossy transfer devices. In some embodiments switch terms are determined at the factory when a VNA is assembled, and are provided to the user.

Figure 3:
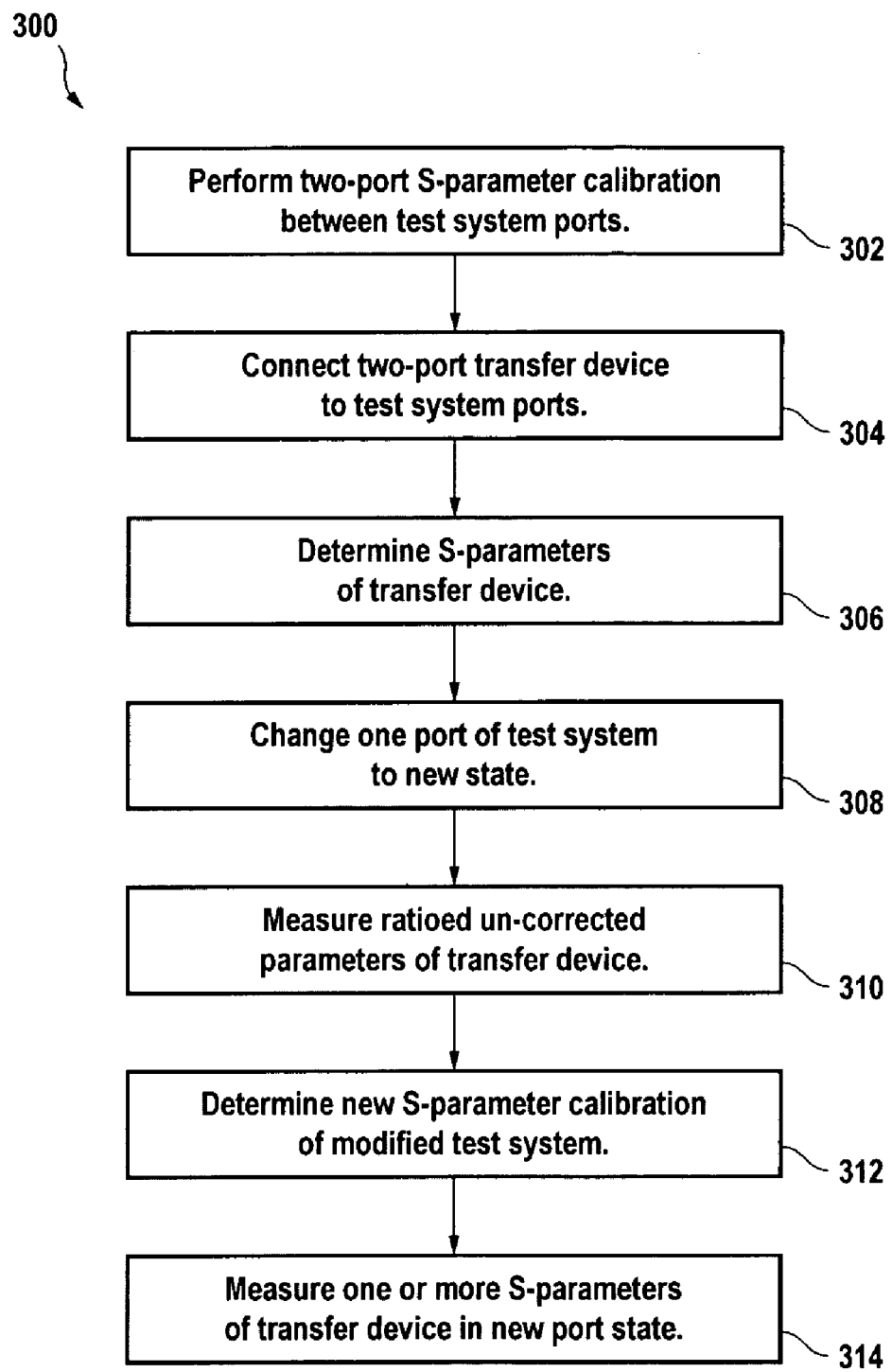
FIG. 3 is a flow chart of a method calibrating a test system using re-calculated error terms according to an embodiment of the invention.

FIG. 3 is a flow chart of a method calibrating a test system using re-calculated error terms 300 according to an embodiment of the invention. A two-port S-parameter calibration is performed between a pair of test ports of a test system having a multi-port VNA (step 302). A stable two-port device ("transfer device") is connected between the test ports of the test system (step 304). The S-parameters of the transfer device are determined using the two-port calibration (step 306). In a particular embodiment, the S-parameters of the transfer device are measured using the VNA-based test system. Alternatively, one or more S-parameters of the transfer device are known or inherent. As used herein, the term "stable" means that the S-parameters of the two-port device remain essentially constant during the initial and subsequent measurements.

With the transfer device connected between the test ports of the test system, one of the test ports is changed to a second state (step 308). In a particular embodiment, the second state is switching one port of the transfer device to a third test port of a multi-port test system having more than two test ports, including embodiments where the third test port is connected to a third port of a VNA, which is possible by doing multiple two-port calibrations between each set of two test ports (e.g. port 1-port 2, port 1-port 3, and port 2-port 3). This approach can be used with N test ports, where N is an integer larger than two. In particular embodiments, the transfer device is one of the calibration standards, thus avoiding an additional disconnection/connection of another device. In yet another embodiment, one or more of the S-parameters of the transfer device is known a-priori or inherent, such as presumed zero transmission loss of an infinitely short transmission line.

Three ratioed un-corrected parameters are measured with the VNA in the forward direction, and three ratioed un-corrected parameters are measured with the VNA in the reverse direction (step 310). The terms "forward" and "reverse" are arbitrary, as is the sequence of these measurements.

A new S-parameter calibration for the modified test system state is determined (step 312) using the six uncorrected ratio measurements, along with the known S-parameters of the two-port device and knowledge of the error terms for the un-changed port of the test system from the initial S-parameter calibration. The transfer device may then be measured in the new test system state using the new S-parameter calibration to provide a calibrated S-parameter measurement of the transfer device (step 314), or one or more S-parameters of a different device may be measured in the modified test system.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A method of calibrating a test system comprising:
    performing at least one two-port S-parameter calibration between a first port and a second port of a test system having a multi-port vector network analyzer to provide a first two-port S-parameter calibration of the test system;
    connecting a transfer device between the first port and the second port;
    changing the first port to provide a second state of the test system;
    measuring a plurality of ratioed un-corrected parameters of the transfer device with the test system in the second state;
    using the plurality of ratioed un-corrected parameters of the transfer device in combination with the first two-port S-parameter calibration of the test system to determine a second two-port S-parameter calibration of the test system in the second state; and
    using the second two-port S-parameter calibration of the test system in the second state to make a calibrated measurement of a device under test.

2. The method of claim 1 further comprising, before connecting the transfer device, measuring a first S-parameter of the device under test, and, after determining the second two-port S-parameter calibration of the test system in the second state, measuring a second S-parameter of the device under test.

3. The method of claim 1 further comprising, before connecting the transfer device, measuring an S-parameter of the device under test, and, after determining a second two-port S-parameter calibration of the test system in the second state, measuring the S-parameter of the device under test.

4. The method of claim 1 wherein measuring a plurality of ratioed un-corrected parameters includes measuring three ratioed un-corrected parameters of the transfer device in a first direction and measuring three ratioed un-corrected parameters of the transfer device in a second direction.

5. The method of claim 1 further comprising, between connecting a transfer device and changing the first port, of determining S-parameters of the transfer device using the first two-port S-parameter calibration.

6. The method of claim 5 wherein determining S-parameters of the transfer device includes measuring S-parameters of the transfer device.

7. The method of claim 5 wherein determining S-parameters of the transfer device occurs prior to connecting the transfer device between the first and second port.

8. The method of claim 1 further comprising, after determining the second S-parameter calibration of the test system, measuring an S-parameter of the transfer device in the second state of the test system.

9. The method of claim 1 further comprising, after determining the second S-parameter calibration of the test system,
    removing the transfer device from the test system;
    connecting a second device between the first port and the second port; and
    measuring an S-parameter of the second device in the second state of the test system.

10. The method of claim 1 wherein changing the first port includes switching an attenuator from a first position to a second position.

11. The method of claim 1 further comprising:
    changing the second port to provide a third state of the test system;
    measuring a second plurality of ratioed un-corrected parameters of the transfer device with the test system in the third state; and
    determining a third S-parameter calibration of the test system in the third state from the second plurality of ratioed un-corrected parameters.

12. The method of claim 1 wherein the first two-port S-parameter calibration is a twelve-term error correction model.

13. A method of calibrating a test system comprising:
    performing at least one two-port S-parameter calibration between a first port and a second port of a test system having a multi-port vector network analyzer to provide a first two-port S-parameter calibration of the test system;
    connecting a device under test between the first port and the second port, and then;
    changing the first port to provide a second state of the test system, and then;
    measuring a plurality of ratioed un-corrected parameters of the device under test with the test system in the second state;
    using the plurality of ratioed un-corrected parameters of the device under test in combination with the first two-port S-parameter calibration of the test system to determine a second two-port S-parameter calibration of the test system in the second state; and
    using the second twelve-term two-port S-parameter calibration of the test system in the second state to make a calibrated S-parameter measurement of the device under test.

* * * * *